United States Patent
Chien et al.

(10) Patent No.: US 9,247,116 B2
(45) Date of Patent: Jan. 26, 2016

(54) IMAGE SENSOR DEVICE WITH LIGHT GUIDING STRUCTURE

(71) Applicant: Taiwan Semiconductor Manufacturing Co., Ltd., Hsin-Chu (TW)

(72) Inventors: Volume Chien, Tainan (TW); Su-Hua Chang, Lucao Township (TW); Zen-Fong Huang, Tainan (TW); Chia-Yu Wei, Tainan (TW); Chi-Cherng Jeng, Tainan (TW); Hsin-Chi Chen, Tainan (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 14 days.

(21) Appl. No.: 14/211,636

(22) Filed: Mar. 14, 2014

(65) Prior Publication Data
US 2015/0264233 A1    Sep. 17, 2015

(51) Int. Cl.
| | | |
|---|---|---|
| *H04N 3/14* | (2006.01) | |
| *H04N 5/335* | (2011.01) | |
| *H04N 9/04* | (2006.01) | |
| *H04N 5/225* | (2006.01) | |
| H01L 31/062 | (2012.01) | |
| H01L 31/113 | (2006.01) | |

(52) U.S. Cl.
CPC .................................. *H04N 5/2254* (2013.01)

(58) Field of Classification Search
CPC ...................... H01L 27/1464; H01L 27/14621; H01L 27/14623; H01L 27/146; H01L 27/14601; H01L 27/1463; H04N 5/2178; H04N 5/361; H04N 2209/045; H04N 2209/046
USPC .................. 348/272–273, 277, 280–281, 243; 257/446–447, 291–294; 438/69–70
See application file for complete search history.

(56) References Cited

U.S. PATENT DOCUMENTS

| | | | |
|---|---|---|---|
| 8,363,136 B2 * | 1/2013 | Akiyama ....................... 348/294 |
| 2010/0110271 A1 * | 5/2010 | Yanagita et al. ............... 348/340 |
| 2012/0147208 A1 * | 6/2012 | Otsuka et al. ................ 348/222.1 |
| 2012/0268631 A1 * | 10/2012 | Takase et al. .................. 348/273 |

\* cited by examiner

*Primary Examiner* — Kelly L Jerabek
(74) *Attorney, Agent, or Firm* — Birch, Stewart, Kolasch & Birch, LLP

(57) ABSTRACT

An image sensor device and a manufacturing method for forming an image sensor device are provided. The image sensor device includes a semiconductor substrate having an array region and a periphery region. The image sensor device also includes a light sensing region in the array region of the semiconductor substrate. The image sensor device further includes a dielectric structure over the array region and the periphery region, and the dielectric structure has a substantially planar top surface. In addition, the image sensor device includes a recess in the dielectric structure and substantially aligned with the light sensing region. The image sensor device also includes a filter in the recess and a light blocking grid in the dielectric structure and surrounding a portion of the filter.

20 Claims, 12 Drawing Sheets

IMAGE SENSOR DEVICE WITH LIGHT GUIDING STRUCTURE

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component that can be created using a fabrication process) has decreased. For these advances, similar developments in IC processing and manufacturing are developed.

Along with the advantages gained from reducing geometric size, improvements are being made directly to the IC devices. One such IC device is an image sensor device. An image sensor device includes a pixel array (or grid) for detecting light and recording intensity (brightness) of the detected light. For example, the pixel array responds to the light by accumulating a charge. The higher the intensity of the light is, the higher the charge is accumulated in the pixel array. The accumulated charge is used (for example, by other circuitry) to provide image information for use in a suitable application, such as a digital camera.

It is desirable to form image sensor devices with improved performance and reliability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
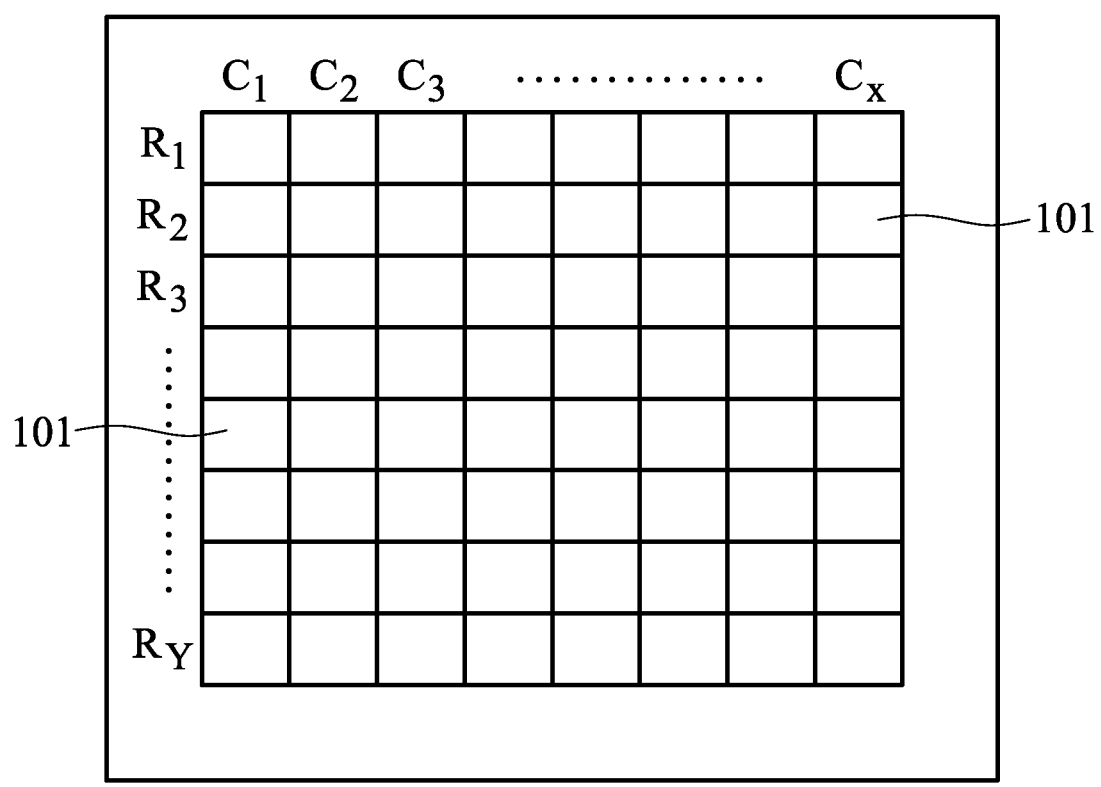
FIG. 1 is a top view of an image sensor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a top view of an image sensor device 10, in accordance with some embodiments. In some embodiments, the image sensor device 10 is a backside illuminated (BSI) image sensor device. However, it should be appreciated that embodiments of the disclosure are not limited to being the BSI image sensor device. In some other embodiments, the image sensor device 10 is a front side illuminated (FSI) image sensor device.

In some embodiments, the image sensor device 10 includes an array region including a number of pixel regions 101. The pixel regions 101 may be arranged into columns (for example, $C_1$ to $C_X$) and rows (for example, $R_1$ to $R_Y$). The term "pixel region" refers to a unit cell containing features such as photodetector and various circuitry. The unit cell may include various semiconductor devices for converting electromagnetic radiation into an electrical signal. The photodetectors in the pixel regions 101 may include photodiodes, complimentary metal-oxide-semiconductor (CMOS) image sensors, charged coupling device (CCD) sensors, active sensors, passive sensors, other applicable sensors, or a combination thereof.

The pixel regions 101 may be designed with various sensor types. One group of pixel regions 101 may be CMOS image sensors, and another group of pixel regions 101 may be other types of sensors, such as passive sensors. In some embodiments, each pixel region 101 includes a photodetector, such as a photogate-type photodetector, for recording intensity or brightness of light (radiation). Each pixel region 101 may also include various semiconductor devices, such as various transistors.

Additional circuitry, inputs, and/or outputs may be formed in a peripheral region of the image sensor device 10 and be coupled to the pixel regions 101. In some embodiments, the periphery region surrounds the array of the pixel regions 101. The circuitry in the peripheral region provides an operation environment for the pixel regions 101 and support communications with the pixel regions 101.

Figure 2:
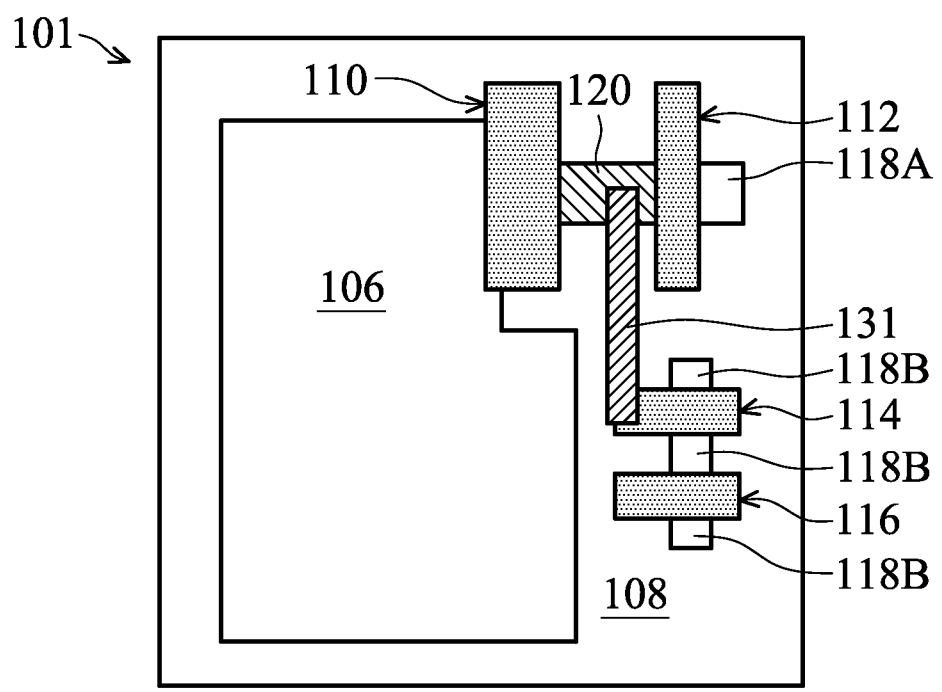
FIG. 2 is a top view of a pixel region of an image sensor device, in accordance with some embodiments.

FIG. 2 is a top view of one of the pixel regions 101 of the image sensor device 10 on a front surface of a semiconductor substrate (not illustrated in FIG. 2), in accordance with some embodiments. As shown in FIG. 2, the pixel region 101 includes a light sensing region 106. In some embodiments, the light sensing region 106 includes a photodiode for recording intensity or brightness of light (radiation). The pixel region 101 may contain various transistors. For example, the transistors include a transfer transistor 110, a reset transistor 112, a source-follower transistor 114, a select transistor 116, other suitable transistors, or a combination thereof.

The pixel region 101 may also include various doped regions in the semiconductor substrate, such as doped regions 118A, 118B, and 120. The doped regions 118A, 118B, and 120 serve as source/drain regions of the previously mentioned transistors. The doped region 120 is also referred to as a floating diffusion region in some embodiments. The doped region 120 is between the transfer transistor 110 and the reset transistor 112, and is one of the source/drain regions for the transfer transistor 110 and the reset transistor 112. In some embodiments, a conductive feature 131 overlaps a portion of a gate stack of the source-follower transistor 114 and connects to the doped region 120.

The image sensor device 10 may also include various isolation structures 108 formed in the semiconductor substrate to isolate various regions of the semiconductor substrate. The isolation structures 108 prevent leakage currents between various regions. In some embodiments, the isolation structures 108 include dielectric isolation structures. The dielectric isolation structures may be formed by using a shallow trench isolation (STI) technique, a deep trench isolation (DTI) technique, other applicable techniques, or a combination thereof.

In some embodiments, the isolation structures 108 may include doped isolation structures formed by an implantation technique or a diffusion technique. In some embodiments, the isolation structures 108 are formed in the pixel region 101 to isolate the light sensing region 106, the transfer transistor 110, the reset transistor 112, the source-follower transistor 114, and the select transistor 116.

The image sensor device 10 further includes a color filter and a lens disposed over a back surface of the semiconductor substrate in some embodiments. The color filter and the lens may be aligned with the light sensing region 106. The lens is used to direct or focus the incident light. The color filter is designed so that it filters through light of a predetermined wavelength band. For example, the color filter may filter through visible light of a red wavelength band, a green wavelength band, or a blue wavelength band to the light sensing region 106.

In the operation of the image sensor device 10 according to some embodiments, the image sensor device 10 is designed to receive radiation traveling towards the back surface of the semiconductor substrate. The lens disposed over the back surface of the semiconductor substrate directs the incident radiation to the corresponding light sensing region 106 in the semiconductor substrate. The incident radiation generates electron-hole pairs. When exposed to the incident radiation, the light sensing region 106 responds to the incident radiation by accumulating electrons. The holes may be trapped by a doped layer over the back surface of the semiconductor substrate to prevent the recombination of the electrons and the holes.

The electrons are transferred from the light sensing region 106 to the doped region 120 when the transfer transistor 110 is turned on. Through the connection of the conductive feature 131, the source-follower transistor 114 may convert the electrons from the doped region 120 to voltage signals. The select transistor 116 may allow a single row (or a single column) of the pixel array to be read by read-out electronics. The reset transistor 112 may act as a switch to reset the doped region 120. When the reset transistor 112 is turned on, the doped region 120 is connected to a power supply to clear all accumulated electrons.

It should be appreciated that embodiments of the disclosure are not limited to being the image sensor device 10 shown in FIG. 1 or 2. In some other embodiments, the image sensor device 10 includes different configurations. In some embodiments, a light guiding structure is formed to improve the performance of the image sensor device.

Figure 3A:
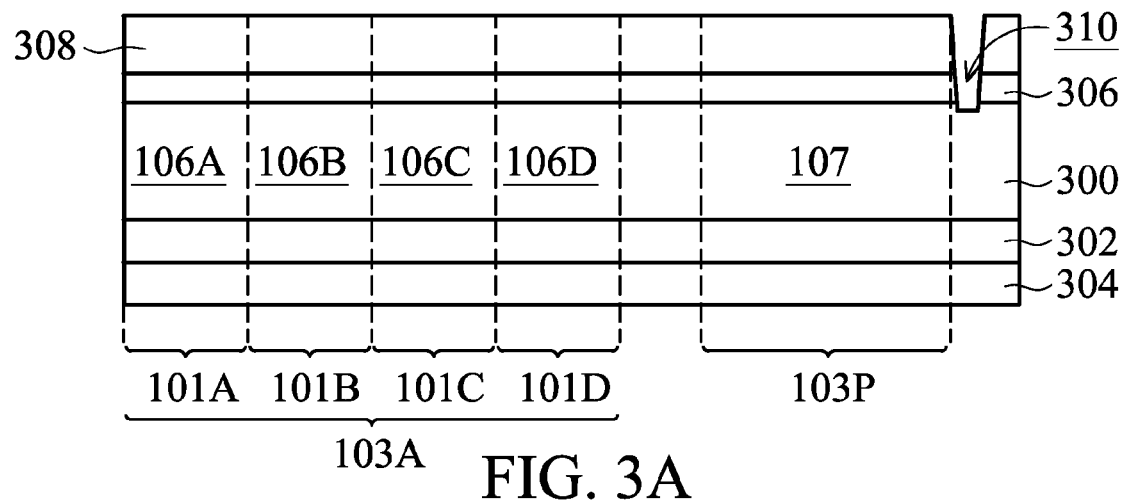
FIGS. 3A-3H are cross-sectional views of various stages of a process for forming an image sensor device, in accordance with some embodiments.

FIGS. 3A-3H are cross-sectional views of various stages of a process for forming an image sensor device, in accordance with some embodiments. As shown in FIG. 3A, a semiconductor substrate 300 is provided. In some embodiments, the semiconductor substrate 300 is defined to mean a construction comprising one or more semiconductor materials. In some embodiments, the semiconductor substrate 300 includes a semiconductor wafer (such as a silicon wafer), or a portion of a semiconductor wafer. In some embodiments, the semiconductor substrate 300 includes an elementary semiconductor material including silicon or germanium in a single crystal, polycrystal, or amorphous structure. In some other embodiments, the semiconductor substrate 300 includes a compound semiconductor, such as silicon carbide, gallium arsenide, gallium phosphide, indium phosphide, indium arsenide, an alloy semiconductor, such as SiGe, GaAsP, AlInAs, AlGaAs, GaInAs, GaInP, GaInAsP, or a combination thereof. In some embodiments, the semiconductor substrate 300 includes multi-layer semiconductors, a semiconductor on insulator (SOI) (such as silicon on insulator or germanium on insulator), or a combination thereof. In some embodiments, the semiconductor substrate 300 is a chip, such as a chip containing image sensor devices.

In some embodiments, the semiconductor substrate 300 has an array region 103A and a periphery region 103P. As shown in FIG. 3A, the array region 103A includes many pixel regions including pixel regions 101A, 101B, 101C, and 101D, in accordance with some embodiments. Similar to the embodiments shown in FIG. 2, each of the pixel regions may include a light sensing region. For example, the pixel regions 101A, 101B, 101C, and 101D include light sensing regions 106A, 106B, 106C, and 106D, respectively. In some embodiments, the light sensing regions 106A, 106B, 106C, and 106D include photodetectors such as photodiodes. In some embodiments, the periphery region 103P surrounds the array region 103A. In some embodiments, a black level correction region 107 is formed in the periphery region 103P of the semiconductor substrate 300. In some embodiments, the black level correction region 107 includes a photodetector having the same or similar configuration as the photodetector in the light sensing region 106A, 106B, 106C, or 106D.

As shown in FIG. 3A, an interconnect structure is formed over a front surface of the semiconductor substrate 300, in accordance with some embodiments. The interconnect structure may include an interlayer dielectric layer 302 and an intermetal dielectric layer 304. The interconnect structure also includes various conductive features (not shown). The conductive features include, for example, multiple horizontal interconnects, such as conductive lines, and multiple vertical interconnects, such as conductive via plugs or conductive contact plugs. The conductive features of the interconnect structure form electrical connections to the device elements formed in or on the semiconductor substrate 300. The device element may be a doped region formed in or over the semiconductor substrate 100. Alternatively, the device element may be a gate electrode formed over or in the semiconductor substrate 300.

In some embodiments, the interlayer dielectric layer 302 and the intermetal dielectric layer 304 are made of silicon oxide, silicon nitride, silicon oxynitride, tetraethylorthosilicate (TEOS) oxide, phosphosilicate glass (PSG), borophosphosilicate glass (BPSG), fluorinated silica glass (FSG), carbon doped silicon oxide, amorphous fluorinated carbon, low-k dielectric material, other suitable materials, or a combination thereof. The low-k dielectric material may have a dielectric constant (k value) less than about 3.9 or less than about 2.8. In some embodiments, the conductive features of the interconnect structure are made of copper, aluminum, tungsten, titanium, nickel, gold, platinum, other suitable materials, or a combination thereof. In some embodiments, a number of deposition, photolithography, and etching processes are performed to form the interconnect structure.

As shown in FIG. 3A, a bottom anti-reflection coating (BARC) layer 306 is formed over a back surface of the semiconductor substrate 300, in accordance with some embodiments. The BARC layer 106 may be used to prevent or reduce reflections during a subsequent patterning process. In some embodiments, the BARC layer 306 is made of a polymer material layer containing carbon, oxygen, and/or nitrogen, other suitable organic polymer materials, or a combination thereof. It should be noted, however, that other dielectric materials may be used. In some embodiments, the BARC 306 is deposited using a chemical vapor deposition (CVD) process, a spin-on process, a physical vapor deposition (PVD) process, other applicable processes, or a combination thereof. Embodiments of the disclosure have many variations. In some other embodiments, the BARC layer 306 is not formed.

As shown in FIG. 3A, a dielectric layer 308 is formed over the BARC layer 306, in accordance with some embodiments. The dielectric layer 308 is a transparent dielectric layer. In some embodiments, the dielectric layer 308 is made of silicon oxide, silicon oxynitride, silicon nitride, other suitable dielectric materials, or a combination thereof. In some embodiments, the dielectric layer 308 is deposited using a CVD process, a PVD process, a spin-on process, other applicable processes, or a combination thereof.

As shown in FIG. 3A, the dielectric layer 308 and the BARC layer 306 are patterned to form one or more openings 310, in accordance with some embodiments. In some embodiments, the opening 310 exposes the semiconductor substrate 300. In some embodiments, the opening 310 extends into the semiconductor substrate 300. A photolithography process and an etching process may be used to form the opening 310. In some embodiments, the opening 310 is used for containing a grounding element. In some other embodiments, the opening 310 is not formed.

Figure 3B:
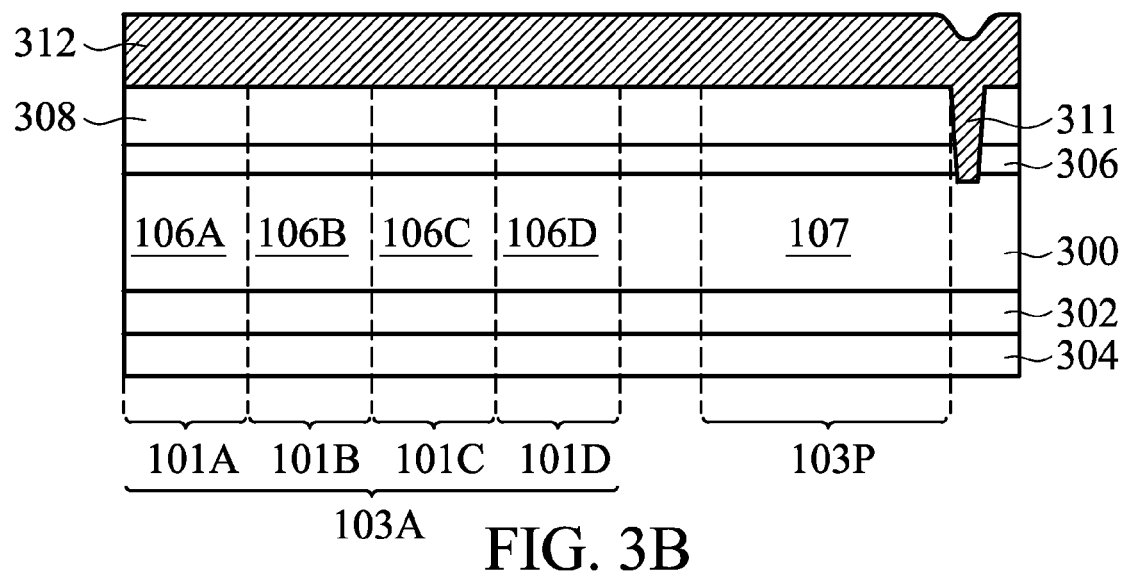

As shown in FIG. 3B, a light blocking layer 312 is deposited over the dielectric layer 308, in accordance with some embodiments. In some embodiments, the light blocking layer 312 fills the opening 310. In some embodiments, the light blocking layer 312 is a metal layer. The metal layer filling the opening 310 forms a grounding element 311. In some embodiments, the grounding element 311 is electrically connected to the semiconductor substrate 300. Due to the grounding element 311, the image sensor device is protected from being damaged during the subsequent formation processes. In some embodiments, the light blocking layer 312 is made of a reflective metal material or a light absorption material. In some embodiments, the light blocking layer 312 is made of aluminum, copper, tungsten, titanium, gold, silver, platinum, nickel, other suitable materials, or a combination thereof. In some embodiments, the light blocking layer is deposited using a PVD process, an electroplating process, a CVD process, a spin-on process, other applicable processes, or a combination thereof.

Figure 3C:
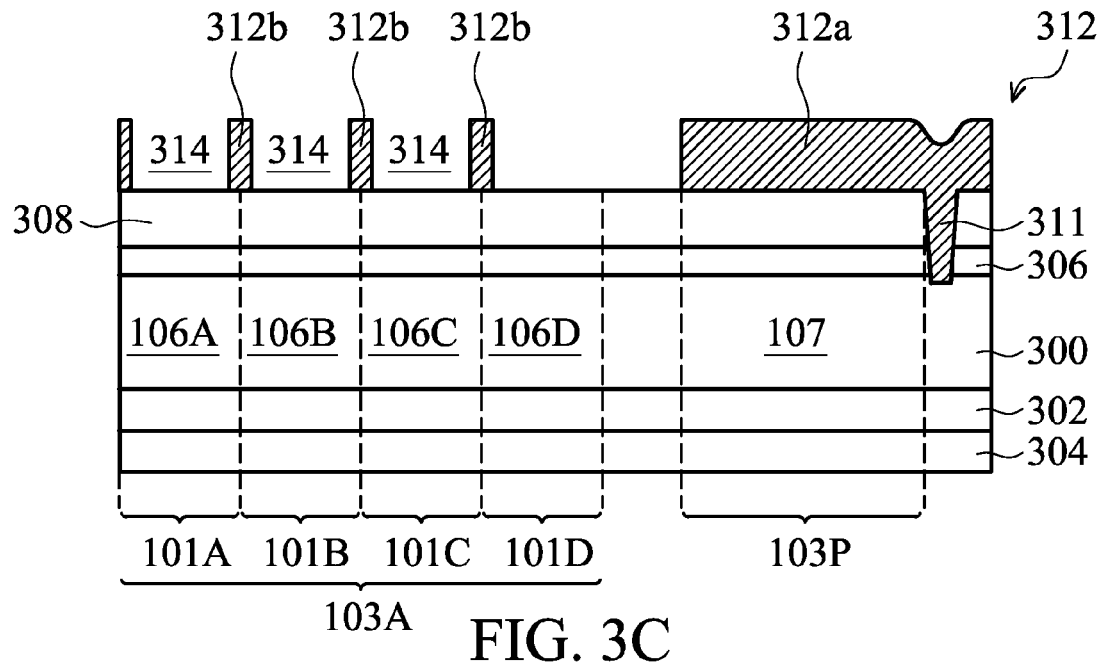

As shown in FIG. 3C, the light blocking layer 312 is patterned to form a light blocking grid 312b and one or more light blocking elements 312a, in accordance with some embodiments. In some embodiments, a photolithography process and an etching process are performed to pattern the light blocking layer 312. In some embodiments, the light blocking grid 312b surrounds one or more openings 314. Each of the openings 314 is substantially aligned with a corresponding light sensing region in the semiconductor substrate 300. In some embodiments, an over etch operation is performed to ensure that substantially no light blocking layer is left on the dielectric layer 308 directly under the openings 314. In some embodiments, shallow recesses (not shown) are formed in the dielectric layer 308 under the openings 314 due to the over etch operation.

Since the light blocking grid 312b and the light blocking element 312a are formed simultaneously from patterning the same light blocking layer 312, the materials of the light blocking grid 312b and the light blocking element 312a are the same, in accordance with some embodiments. However, embodiments of the disclosure are not limited thereto. In some embodiments, the light blocking grid 312b and the light blocking element 312a are not formed from the same layer. In these cases, the materials of the light blocking grid 312b and the light blocking element 312a may be different from each other. The light blocking grid 312b and the light blocking element 312a are not formed simultaneously.

In some embodiments, the light blocking element 312a is positioned over the periphery region 103P of the semiconductor substrate 300. A shown in FIG. 3C, the light blocking element 312a covers the black level correction region 107, in accordance with some embodiments. The light blocking element 312a is used to prevent an external light from entering the black level correction region 107. For example, the external light is reflected or absorbed by the light blocking element 312a without entering the black level correction region 107. Therefore, the signal of the photodetector formed in the black level correction region 107 may be used for black level correction.

As shown in FIG. 3C, the light blocking element 312a is electrically connected to the grounding element 311, in accordance with some embodiments. In some embodiments, the materials of the grounding element 311, the light blocking element 312a, and the light blocking grid 312b are the same. In some embodiments, the light blocking layer 312 is made of a metal material. The light blocking grid 312b is therefore a metal grid.

Figure 3D:
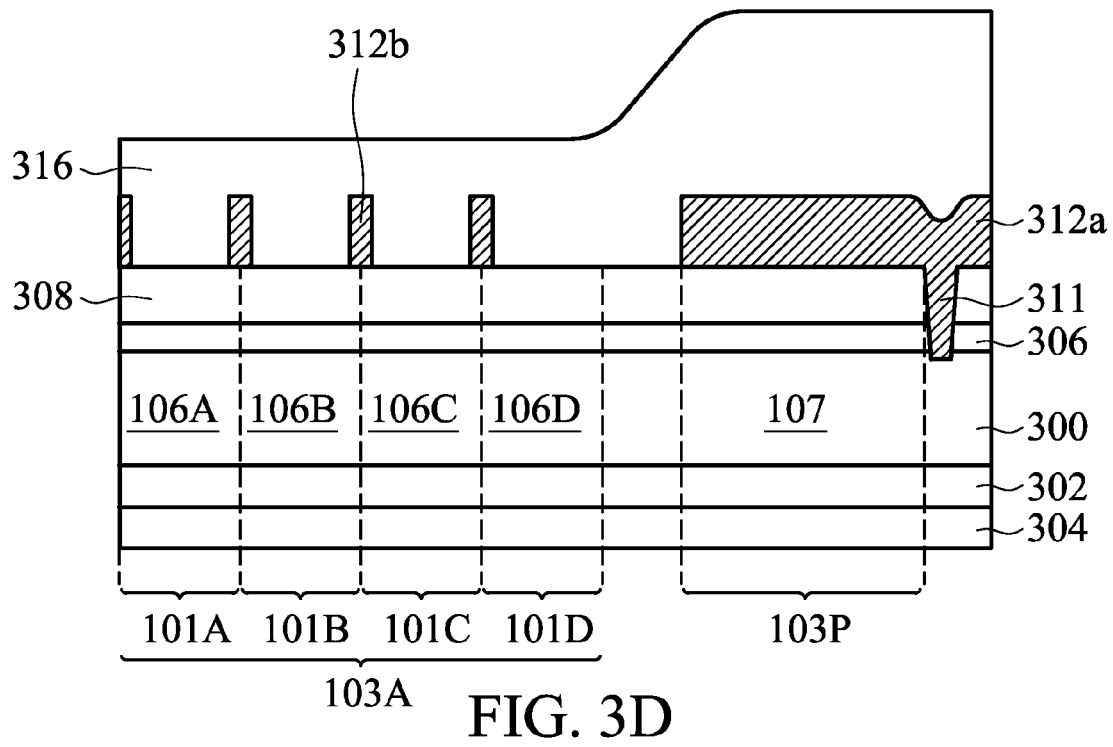
Figure 3E:
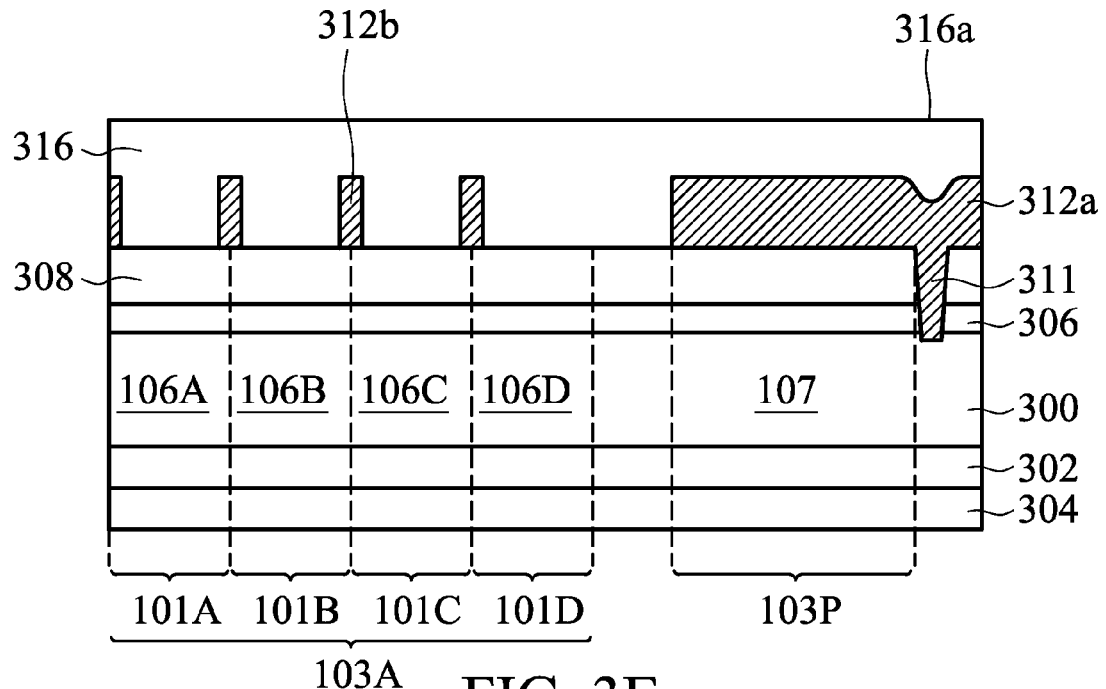

As shown in FIG. 3D, a dielectric layer 316 is deposited over the dielectric layer 308, the light blocking element 312a, and the light blocking grid 312b, in accordance with some embodiments. In some embodiments, the dielectric layer 308 is a transparent dielectric layer. The dielectric layer 316 may be made of silicon oxide, silicon oxynitride, silicon nitride, other suitable materials, or a combination thereof. In some embodiments, the dielectric layer 316 is deposited using a CVD process, a spin-on process, a PVD process, other applicable processes, or a combination thereof.

In some embodiments, the dielectric layer 316 has a protruding portion over the light blocking element 312a. That is, there is a step height between portions of the dielectric layer 316 over the periphery region 103P and the array region 103A. In some cases, the step height may cause the subsequent processes difficult to perform. For example, stress and/or charges may concentrate at the protruding portion of the dielectric layer 316. As a result, the performance and reliability of the image sensor device may be negatively affected.

As shown in 3E, a planarization process is performed on the dielectric layer 316, in accordance with some embodiments. After the planarization process, the dielectric layer 316 is planarized to have a substantially planar (or flat) top surface 316a. In some embodiments, the planarization process includes a chemical mechanical polishing (CMP) process, a grinding process, an etching process, other applicable processes, or a combination thereof. Due to the planarization process, the step height between different regions is eliminated. Therefore, the problems previously described may be avoided or significantly reduced.

Figure 3F:
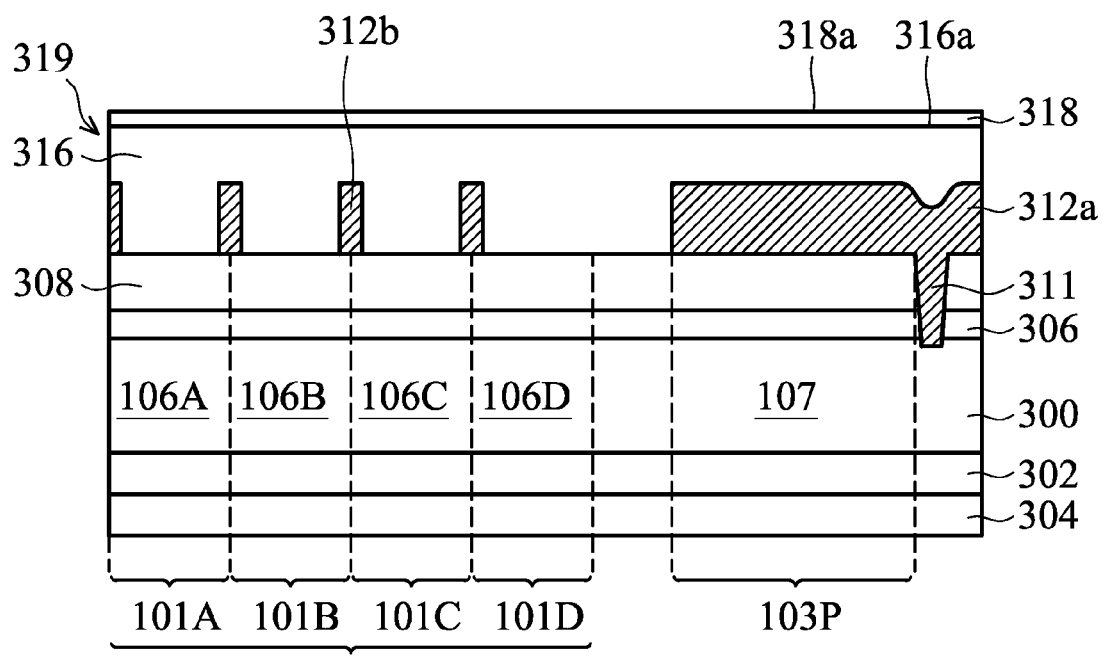

As shown in FIG. 3F, an anti-reflection coating (ARC) layer 318 is deposited over the dielectric layer 316, in accordance with some embodiments. In some embodiments, the ARC layer 318 is made of silicon oxynitride or other suitable materials. In some embodiments, the ARC layer 318 is deposited using a CVD process, a spin-on process, a PVD process, other applicable processes, or a combination thereof. In some embodiments, the dielectric layers 308 and 316 and the ARC layer 318 together form a dielectric structure 319. As shown in FIG. 3F, the dielectric structure 319 has a substantially planar top surface which is the top surface 318a of the ARC layer 318. Embodiments of the disclosure have many variations. In some other embodiments, the ARC layer 318 is not formed. In these cases, the dielectric structure 319 does not include the ARC layer 318. The dielectric structure 319 has a substantially planar top surface which is the top surface 316a of the dielectric layer 316.

Figure 3G:
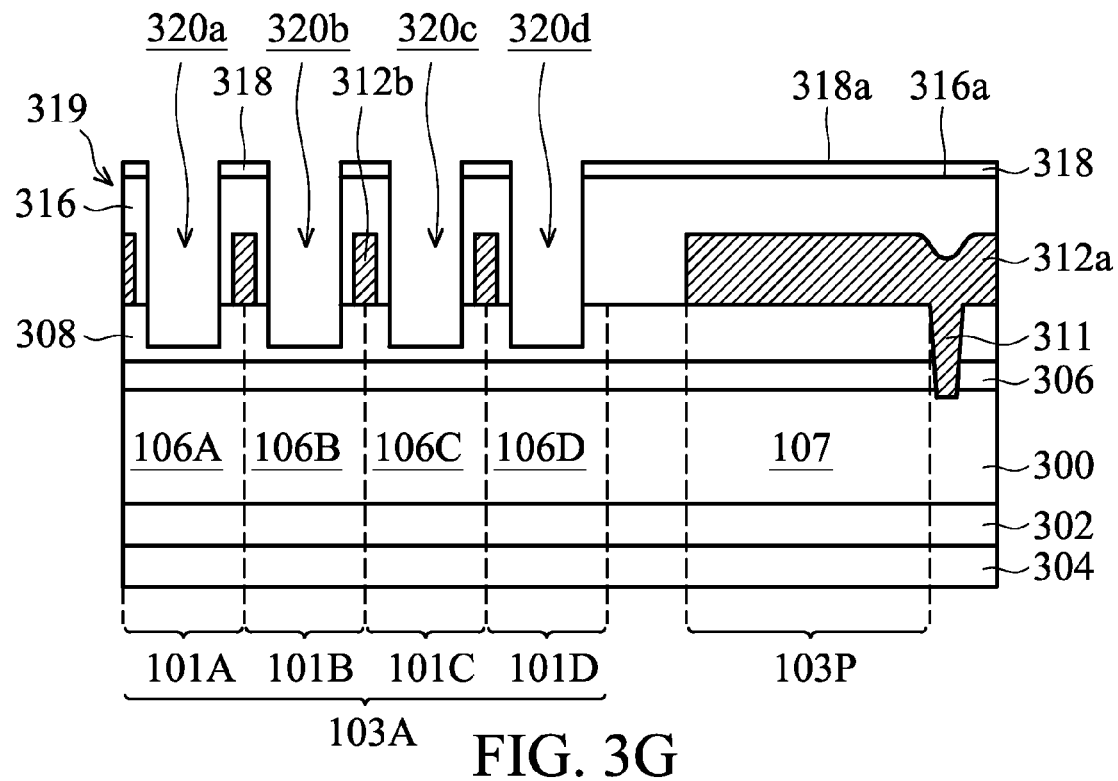

As shown in FIG. 3G, the dielectric structure 319 is patterned to form one or more recesses in the dielectric structure 319, in accordance with some embodiments. The recesses include, for example, recesses 320a, 320b, 320c, and 320d. In some embodiments, the recesses 320a, 320b, 320c, and 320d are substantially aligned with the light sensing regions 106A, 106B, 106C, and 106D, respectively. In some embodiments, a photolithography process and an etching process are used to form the recesses 320a, 320b, 320c, and 320d. In some embodiments, the recesses penetrate through the ARC layer 318 and the dielectric layer 316. In some embodiments, the recesses further extend into the dielectric layer 308.

Figure 3H:
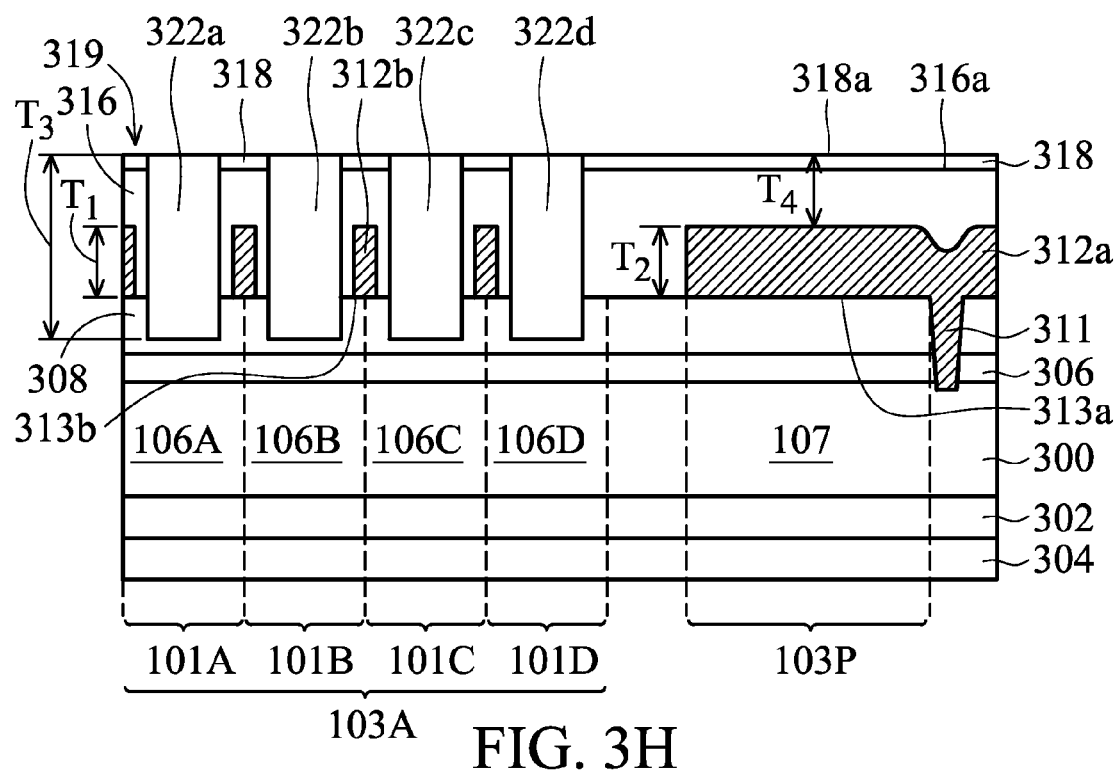

As shown in FIG. 3H, filters are formed in the recesses 320a, 320b, 320c, and 320d, in accordance with some embodiments. In some embodiments, the filters are color filters with different colors or the same color. As shown in FIG. 3H, filters 322a, 322b, 322c, and 322d are formed in the recesses 320a, 320b, 320c, and 320d, respectively. In some embodiments, the filters 322a, 322b, 322c, and 322d are made of dye-based polymer materials, pigment-based polymer materials, other suitable materials, or a combination thereof. In some embodiments, filters 322a, 322b, 322c, and 322d are sequentially formed using spin-on processes and photolithography processes. In some embodiments, a microlens array (not shown) or other suitable element is formed over the filter.

Figure 6:
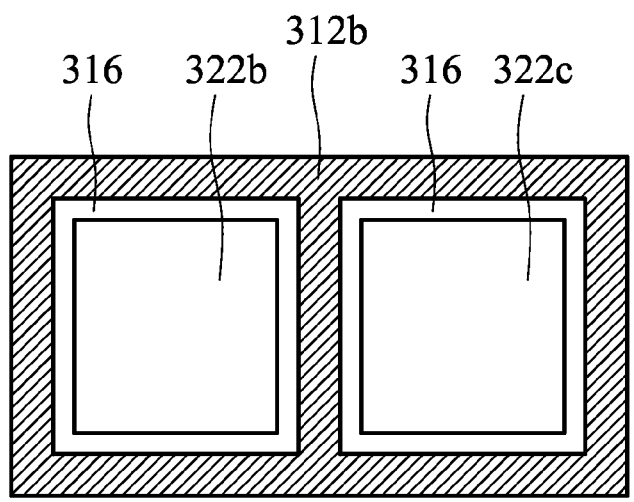
FIG. 6 is a top view of an image sensor device, in accordance with some embodiments.

As shown in FIG. 3H, the light blocking grid 318 in the dielectric structure 319 surrounds a portion of the filter, in accordance with some embodiments. FIG. 6 is a top view of an image sensor device, in accordance with some embodiments. In some embodiments, the light blocking grid 312b surrounds a portion of the dielectric layer 316 and a portion of the filter 322b, as shown in FIGS. 3H and 6. In some embodiments, the light blocking grid 312b also surrounds a portion of other filters, such as the filter 322c. In some embodiments, the light blocking grid 312b and the dielectric structure 319 together form a light guiding structure (or a composite grid). In some embodiments, due to the light blocking grid 312b of the light guiding structure, cross-talk between neighboring pixel regions are significantly reduced or prevented.

As shown in FIG. 3H, the light blocking grid 312b has a thickness $T_1$, and the light blocking element 312a has a thickness $T_2$. In some embodiments, the thicknesses $T_1$ and $T_2$ are substantially the same. In some embodiments, the thickness $T_1$ is in a range from about 2000 Å to about 4000 Å. In some embodiments, the bottom 313a of the light blocking element 312a and the bottom 313b of the light blocking grid 312b are coplanar with each other, as shown in FIG. 3H.

As shown in FIG. 3H, the filter has a thickness $T_3$. In some embodiments, the thickness $T_3$ is in a range from about 7000 Å to about 9000 Å. In some embodiments, both the top and the bottom of the light blocking grid 312b are between the top and the bottom of the filter, as shown in FIG. 3H. In some embodiments, the light blocking grid 312b surrounds a middle portion of the filter. In some embodiments, a thickness ratio of the thickness $T_1$ to the thickness $T_3$ ($T_1/T_3$) is in a range from about 22% to about 58%. In some embodiments, a distance $T_4$ is between the top of the light blocking element 312a and the top of the dielectric structure 319. In some embodiments, the distance $T_4$ is in a range from about 1000 Å to about 3000 Å.

Embodiments of the disclosure have many variations. For example, the dielectric structure is not limited to being planarized by using a planarization process. In some embodiments, the dielectric structure includes a deposited layer having a substantially planar top surface. No additional planarization process needs to be performed to provide the dielectric structure with a substantially planar top surface.

Figure 4A:
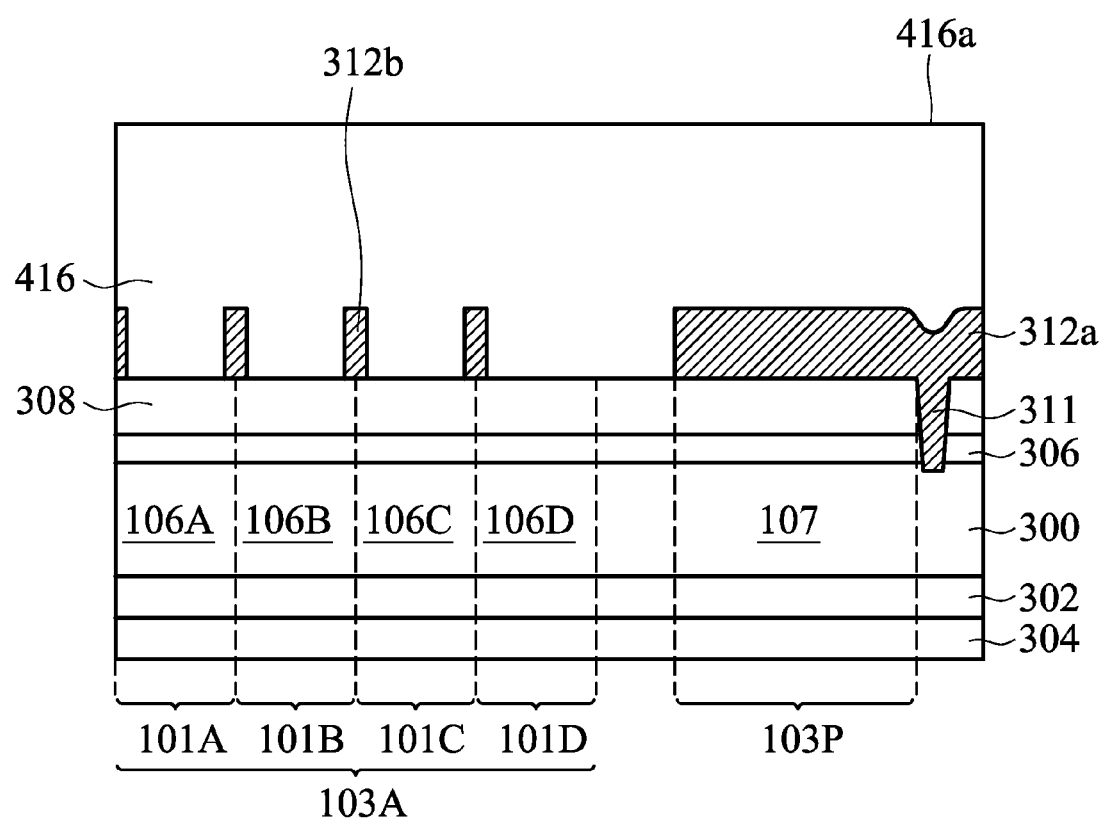
FIGS. 4A-4D are cross-sectional views of various stages of a process for forming an image sensor device, in accordance with some embodiments.

FIGS. 4A-4D are cross-sectional views of various stages of a process for forming an image sensor device, in accordance with some embodiments. As shown in FIG. 4A, a structure similar to that shown in FIG. 3C is provided, in accordance with some embodiments. Afterwards, a dielectric layer 416 is deposited over the structure, as shown in FIG. 4A in accordance with some embodiments. In some embodiments, the dielectric layer 416 is made of a material similar to that of the dielectric layer 316. In some embodiments, the dielectric layer 416 is deposited using a spin-on process. The dielectric layer 416 is a spin-on glass (SOG) in some embodiments. In some embodiments, the as-deposited dielectric layer 416 has a substantially planar top surface 416a. No planarization process needs to be performed to provide the dielectric layer 416 with a substantially planar top surface in some embodiments.

Figure 4B:
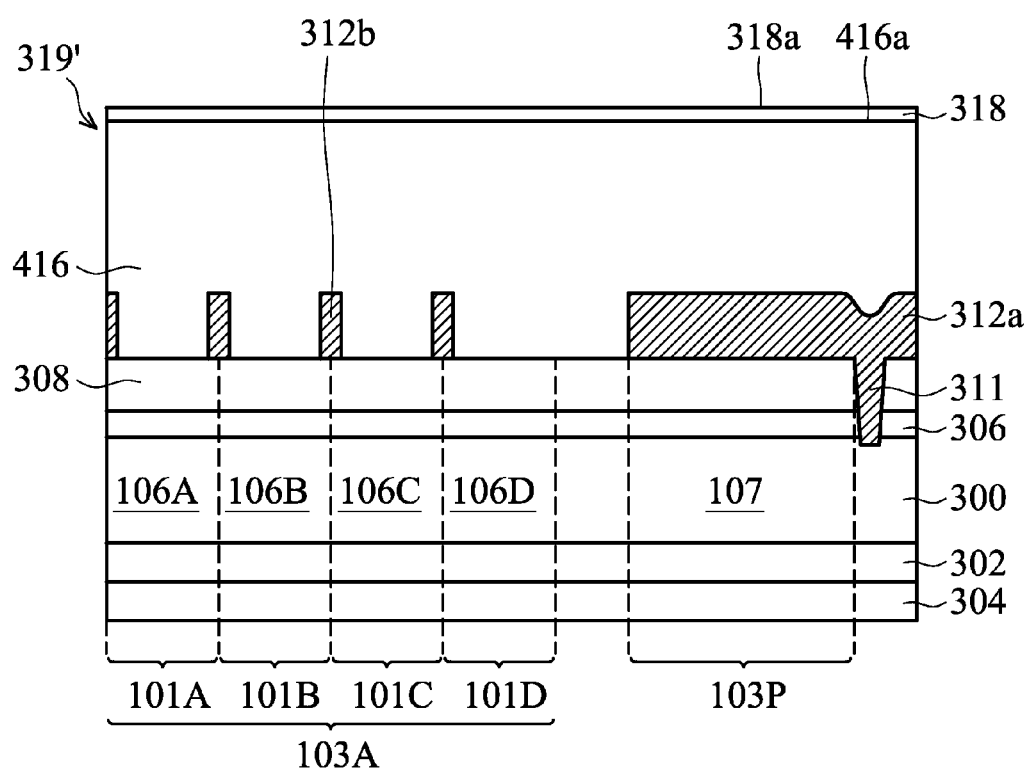

As shown in FIG. 4B, the ARC layer 318 is deposited over the dielectric layer 416, in accordance with some embodiments. Similarly, the ARC layer 318 and the dielectric layers 416 and 308 together form the dielectric structure 319'. In some other embodiments, the ARC layer 318 is not formed. In these cases, the dielectric structure 319' does not include the ARC layer 318.

Figure 4C:
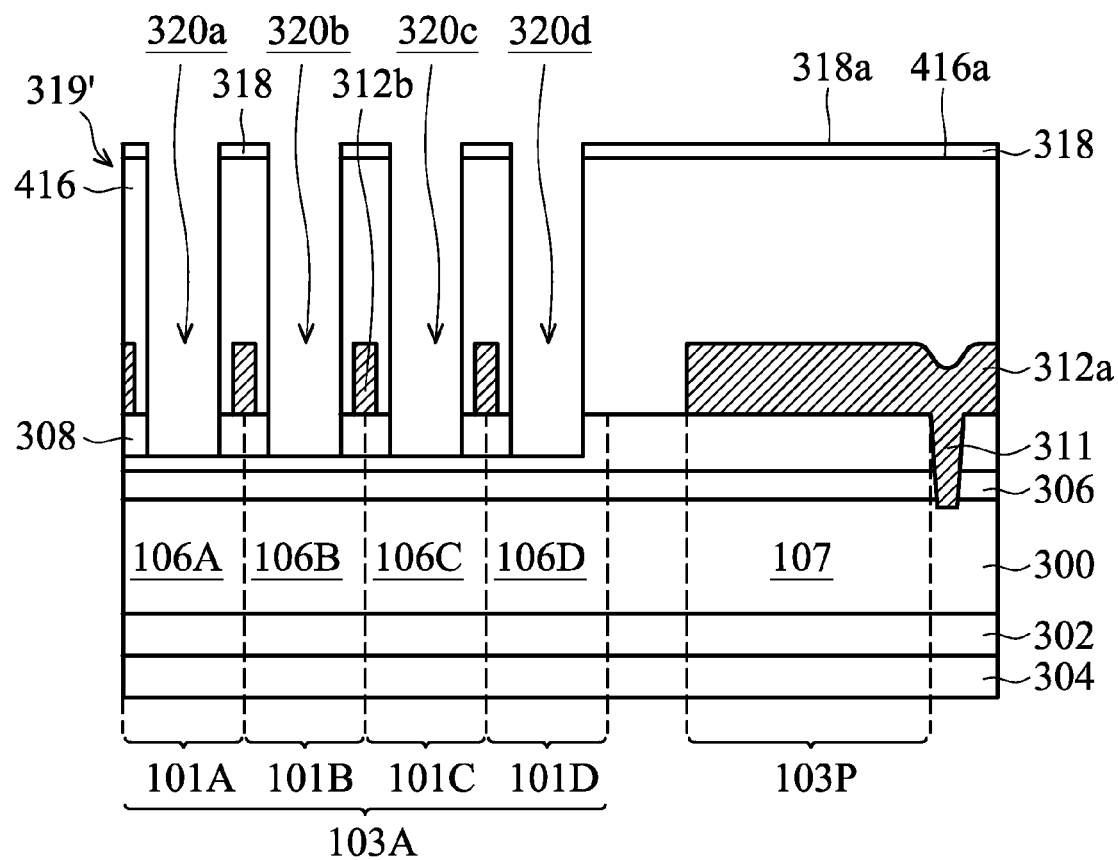
Figure 4D:
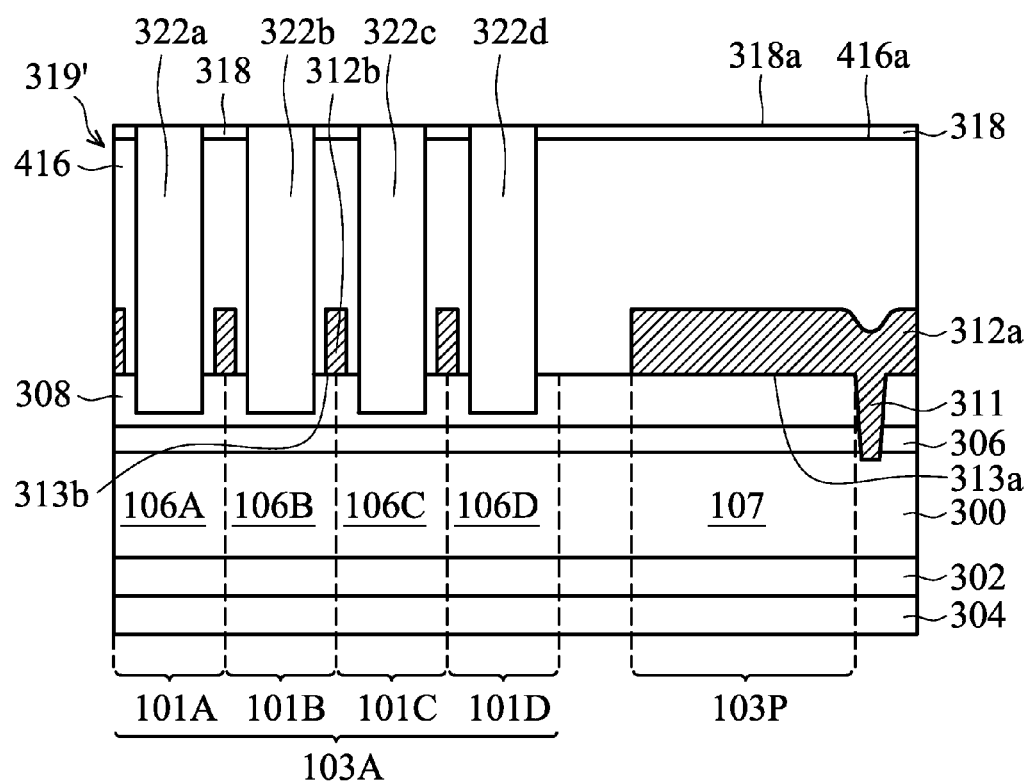

Afterwards, as shown in FIGS. 4C and 4D, processes similar to those illustrated in FIGS. 3G and 3H are performed to form an image sensor device, in accordance with some embodiments. Similarly, because the dielectric structure 319' has the substantially planar top surface 318a or 416a, stress and/or charges are prevented from being concentrated. The performance and reliability of the image sensor device are significantly improved.

As mentioned above, the dielectric structure is patterned to form recesses for containing the filters. Embodiments of the disclosure have many variations. For example, an etch stop layer may be used to assist in the formation of the recesses.

Figure 5A:
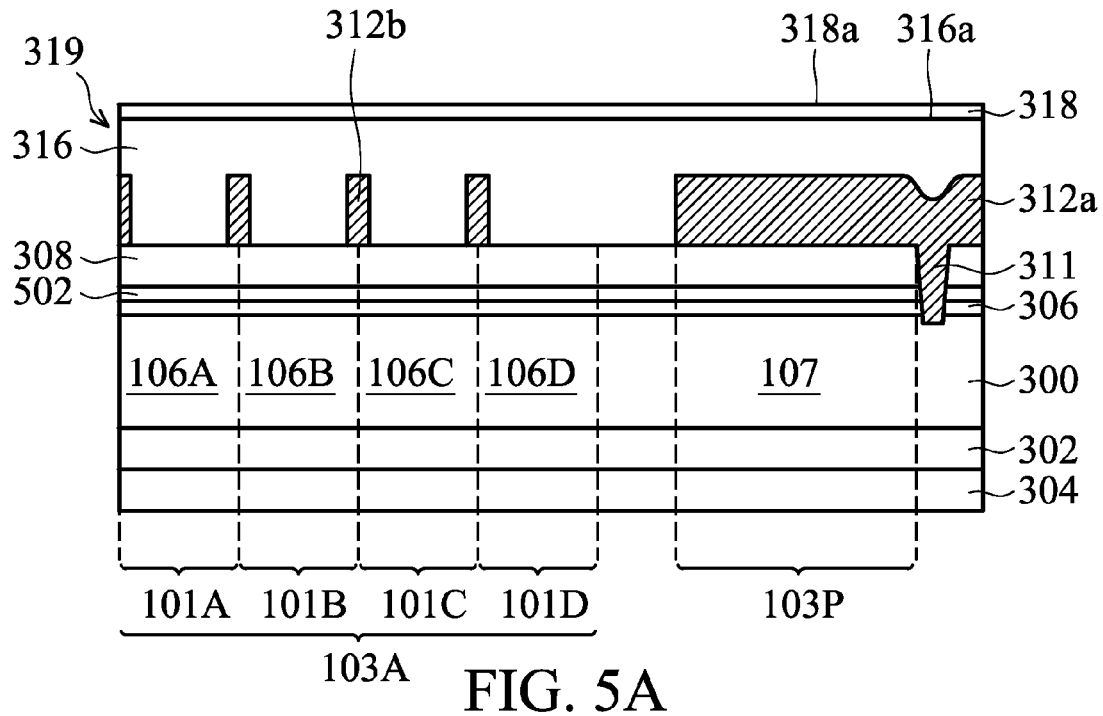
FIGS. 5A-5C are cross-sectional views of various stages of a process for forming an image sensor device, in accordance with some embodiments.
Figure 5B:
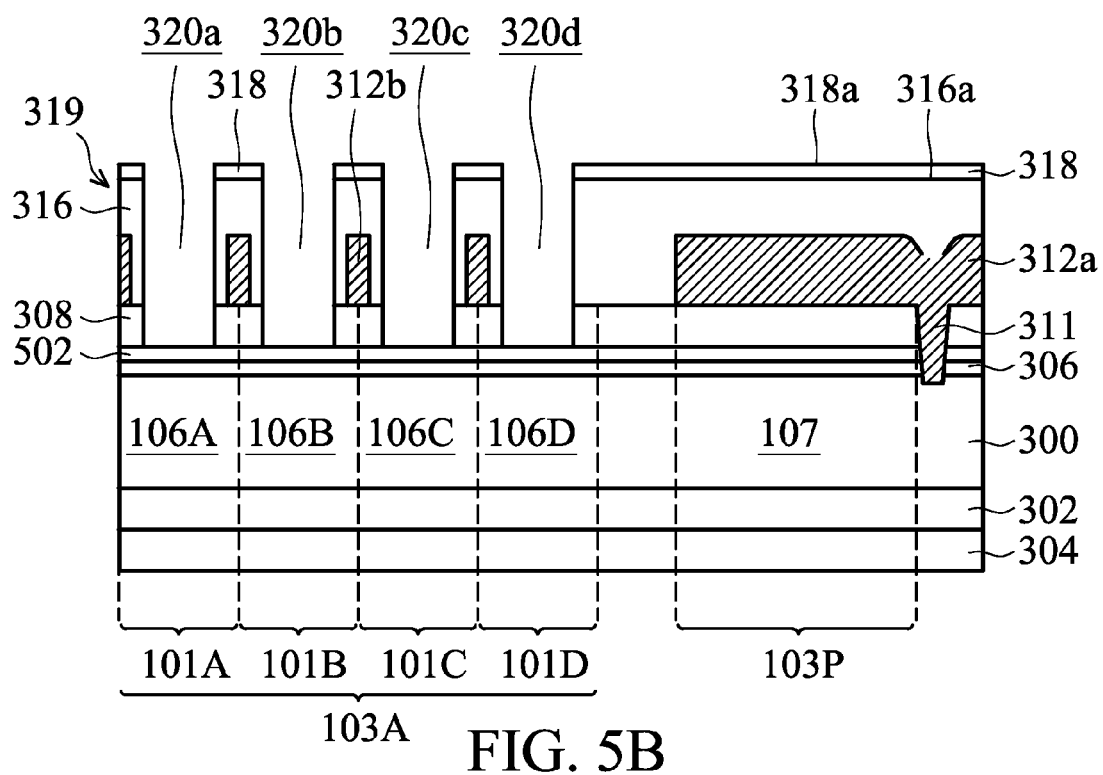
Figure 5C:
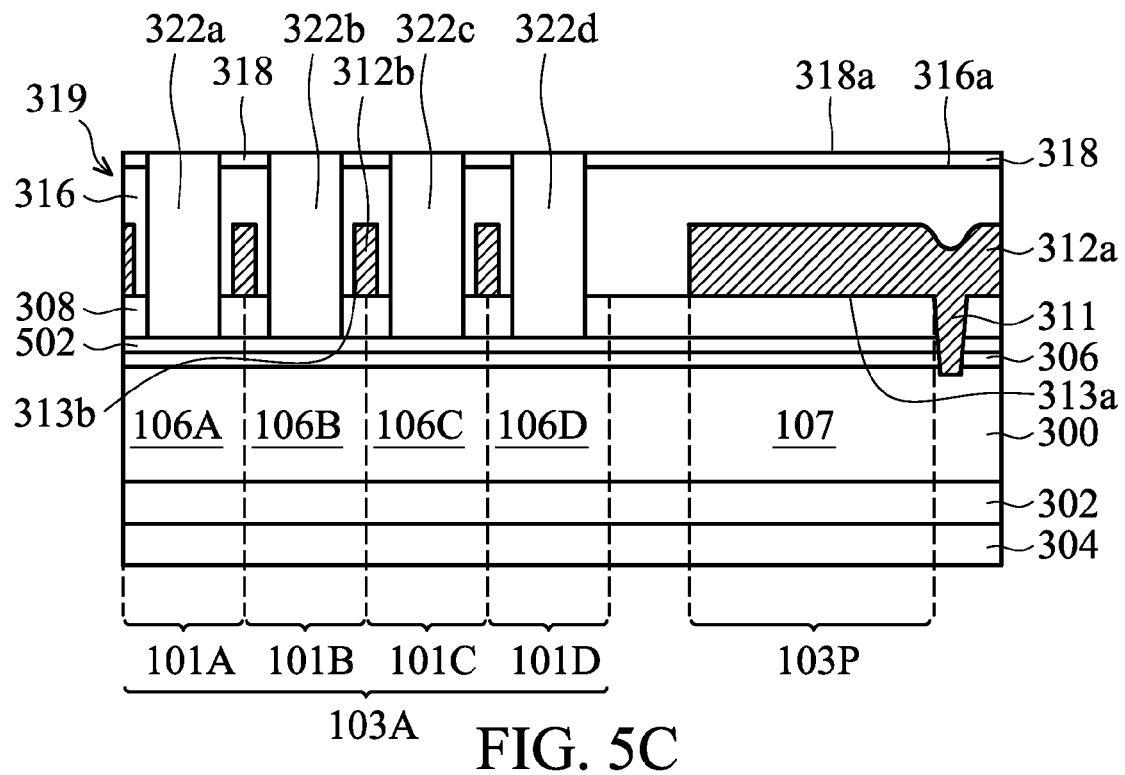

FIGS. 5A-5C are cross-sectional views of various stages of a process for forming an image sensor device, in accordance with some embodiments. As shown in FIG. 5A, a structure similar to that shown in FIG. 3F is provided, in accordance with some embodiments. The main difference between the embodiments shown in FIGS. 5 and 3 is that an etch stop layer 502 is formed over the semiconductor substrate 300 before the dielectric layer 308 is formed. In some embodiments, the etch stop layer 502 is made of silicon nitride, silicon oxynitride, other suitable materials, or a combination thereof. In some embodiments, the etch stop layer 502 is deposited using a CVD process, a spin-on process, a PVD process, other applicable processes, or a combination thereof. Similarly, the ARC layer 318 and the dielectric layers 316 and 308 together form the dielectric structure 319. In some other embodiments, the ARC layer 318 is not formed. In these cases, the dielectric structure 319 does not include the ARC layer 318.

Afterwards, as shown in FIGS. 5B and 5C, processes similar to those illustrated in FIGS. 3G and 3H are performed to form an image sensor device, in accordance with some embodiments. As shown in FIG. 5B, due to the etch stop layer 502, the formation of the recesses 320a, 320b, 320c, and 320d is easier. The etch stop layer 502 may be used to prevent the semiconductor substrate 300 from being damaged during the patterning of the dielectric structure 319. Similarly, because the dielectric structure 319 has the substantially planar top surface 318a or 316a, stress and/or charges are prevented from being concentrated. The performance and reliability of the image sensor device are significantly improved.

Embodiments of the disclosure provide structures and formation methods of image sensor devices with light guiding structures. A dielectric structure of the light guiding structure provides a substantially planar top surface. Therefore, stress and/or charges are prevented from being concentrated. Due to the light guiding structure, crosstalk between neighboring pixel regions is also prevented or significantly reduced. The performance and the reliability of the image sensor device are greatly improved.

In accordance with some embodiments, an image sensor device is provided. The image sensor device includes a semiconductor substrate having an array region and a periphery region. The image sensor device also includes a light sensing region in the array region of the semiconductor substrate. The image sensor device further includes a dielectric structure over the array region and the periphery region, and the dielectric structure has a substantially planar top surface. In addition, the image sensor device includes a recess in the dielectric structure substantially aligned with the light sensing region. The image sensor device also includes a filter in the recess and a light blocking grid in the dielectric structure surrounding a portion of the filter.

In accordance with some embodiments, an image sensor device is provided. The image sensor device includes a semiconductor substrate and a light sensing region in the semiconductor substrate. The image sensor device also includes a black level correction region in the semiconductor substrate. The image sensor device further includes a dielectric structure over the light sensing region and the black level correction region, and the dielectric structure has a substantially planar top surface. In addition, the image sensor device includes a recess in the dielectric structure substantially aligned with the light sensing region. The image sensor device also includes a filter in the recess and a light blocking grid in the dielectric structure surrounding a portion of the filter.

In accordance with some embodiments, a method for forming an image sensor device is provided. The method includes providing a semiconductor substrate, and a light sensing region is formed in the semiconductor substrate. The method also includes forming a first dielectric layer over the semiconductor substrate and forming a light blocking grid over the first dielectric layer. The light blocking grid surrounds an opening, and the opening is substantially aligned with the light sensing region. The method further includes forming a light blocking element over the first dielectric layer. In addition, the method includes forming a second dielectric layer over the light blocking grid and the light blocking element, and the second dielectric layer has a substantially planar top surface. The method also includes forming a filter in the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor device, comprising:
   a semiconductor substrate having an array region and a periphery region;
   a light sensing region in the array region of the semiconductor substrate;
   a dielectric structure over the array region and the periphery region, wherein the dielectric structure has a substantially planar top surface;
   a recess in the dielectric structure substantially aligned with the light sensing region;
   a filter in the recess; and
   a light blocking grid in the dielectric structure surrounding a portion of the filter, wherein a bottom of the recess is below a bottom of the light blocking grid.

2. The image sensor device as claimed in claim 1, wherein the light blocking grid is a metal grid.

3. The image sensor device as claimed in claim 1, further comprising a light blocking element in the dielectric structure over the periphery region of the semiconductor substrate.

4. The image sensor device as claimed in claim 3, wherein the light blocking element is over a black level correction region in the semiconductor substrate.

5. The image sensor device as claimed in claim 3, wherein bottoms of the light blocking element and the light blocking grid are coplanar with each other, and thicknesses of the light blocking element and the light blocking grid are substantially the same.

6. The image sensor device as claimed in claim 3, wherein materials of the light blocking element and the light blocking grid are the same.

7. The image sensor device as claimed in claim 3, further comprising a grounding element in the dielectric structure and electrically connected to the semiconductor substrate.

8. The image sensor device as claimed in claim 7, wherein the grounding element is electrically connected to the light blocking element.

9. The image sensor device as claimed in claim 7, wherein materials of the grounding element and the light blocking grid are the same.

10. The image sensor device as claimed in claim 1, further comprising an etch stop layer between the recess and the semiconductor substrate.

11. An image sensor device, comprising:
    a semiconductor substrate;
    a light sensing region in the semiconductor substrate;
    a black level correction region in the semiconductor substrate;
    a dielectric structure over the light sensing region and the black level correction region, wherein the dielectric structure has a substantially planar top surface;
    a recess in the dielectric structure and substantially aligned with the light sensing region;
    a filter in the recess; and
    a light blocking grid in the dielectric structure and surrounding a portion of the filter, wherein a bottom of the recess is below a bottom of the light blocking grid.

12. The image sensor device as claimed in claim 11, further comprising a light blocking element in the dielectric structure over the black level correction region.

13. The image sensor device as claimed in claim 12, wherein materials of the light blocking element and the light blocking grid are the same.

14. The image sensor device as claimed in claim 13, wherein the light blocking grid is a metal grid.

15. The image sensor device as claimed in claim 11, further comprising a grounding element in the dielectric structure and electrically connected to the semiconductor substrate.

16. A method for forming an image sensor device, comprising:

providing a semiconductor substrate, wherein a light sensing region is formed in the semiconductor substrate;

forming a first dielectric layer over the semiconductor substrate;

forming a light blocking grid over the first dielectric layer, wherein the light blocking grid surrounds an opening, and the opening is substantially aligned with the light sensing region;

forming a light blocking element over the first dielectric layer;

forming a second dielectric layer over the light blocking grid and the light blocking element, wherein the second dielectric layer has a substantially planar top surface;

forming a recess in the second dielectric layer such that a bottom of the recess is below a bottom of the light blocking grid; and forming a filter in the recess.

17. The method for forming an image sensor device as claimed in claim 16, wherein the recess extends into the first dielectric layer.

18. The method for forming an image sensor device as claimed in claim 16, wherein the light blocking grid and the light blocking element are formed simultaneously.

19. The method for forming an image sensor device as claimed in claim 16, wherein the formation of the second dielectric layer comprises:

depositing the second dielectric layer over the light blocking grid and the light blocking element; and planarizing the second dielectric layer to provide the second dielectric layer with the substantially planar top surface.

20. The method for forming an image sensor device as claimed in claim 16, further comprising forming a grounding element between the light blocking element and the semiconductor substrate.

* * * * *